(12) United States Patent
Ikeda

(10) Patent No.: US 10,957,834 B2
(45) Date of Patent: Mar. 23, 2021

(54) LIGHT-EMITTING DEVICE

(71) Applicant: NICHIA CORPORATION, Anan (JP)

(72) Inventor: Tadaaki Ikeda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/594,846

(22) Filed: Oct. 7, 2019

(65) Prior Publication Data

US 2020/0111940 A1 Apr. 9, 2020

(30) Foreign Application Priority Data

Oct. 9, 2018 (JP) .............................. JP2018-190608

(51) Int. Cl.
*H01L 33/62* (2010.01)
*H01L 33/48* (2010.01)

(52) U.S. Cl.
CPC ............ *H01L 33/62* (2013.01); *H01L 33/486* (2013.01)

(58) Field of Classification Search
CPC .................................................... H01L 33/486
See application file for complete search history.

(56) References Cited

U.S. PATENT DOCUMENTS

| 5,035,483 A * | 7/1991 | Waitl | H01L 33/486 385/14 |
|---|---|---|---|
| 2002/0094177 A1 | 7/2002 | Horio | |
| 2002/0154366 A1 | 10/2002 | Horio | |
| 2014/0197447 A1 | 7/2014 | Kitano et al. | |
| 2015/0295152 A1 | 10/2015 | Yoneda et al. | |
| 2017/0179344 A1 | 6/2017 | Matsuda | |
| 2017/0285281 A1 | 10/2017 | Aikou | |
| 2018/0182945 A1 | 6/2018 | Shimabukuro | |

FOREIGN PATENT DOCUMENTS

| JP | H03-022486 A | 1/1991 |
|---|---|---|
| JP | 2002-176184 A | 6/2002 |
| JP | 2002-198572 A | 7/2002 |
| JP | 2002-324916 A | 11/2002 |
| JP | 2011-091344 A | 5/2011 |
| JP | 2012-129272 A | 7/2012 |
| JP | 2013-045842 A | 3/2013 |
| JP | 2013-110210 A | 6/2013 |
| JP | 2014-033237 A | 2/2014 |
| JP | 2014-110333 A | 6/2014 |
| JP | 2015-201605 A | 11/2015 |
| JP | 2017-118098 A | 6/2017 |
| JP | 2018-107207 A | 7/2018 |
| WO | WO-2016/047417 A1 | 3/2016 |

* cited by examiner

*Primary Examiner* — William A Harriston
(74) *Attorney, Agent, or Firm* — Foley & Lardner LLP

(57) ABSTRACT

A light-emitting device having an upper surface, a lower surface opposite to the upper surface, and a first lateral surface, the upper surface serving as a light-emitting surface, the first lateral surface being adjacent and orthogonal to the upper surface, the first lateral surface serving as a mounting surface, the light-emitting device including: a pair of a first metal films disposed at the lower surface; and a pair of second metal films disposed at the first lateral surface; wherein an area of each of the second metal films is larger than an area of each of the first metal films.

16 Claims, 11 Drawing Sheets

US 10,957,834 B2

LIGHT-EMITTING DEVICE

CROSS-REFERENCE TO RELATED APPLICATIONS

The present application claimed priority to Japanese Application No. 2018-190608, filed on Oct. 9, 2018, the contents of which are hereby incorporated by reference in their entirety.

BACKGROUND

The present disclosure relates to a light-emitting device.

Japanese Patent Publication No. 2014-110333 discloses a light-emitting device including an upper surface that serves as a light-emitting surface and a pair of electrodes that serve as external electrodes on a lower surface opposite to the upper surface.

SUMMARY

In the case in which such a light-emitting device is mounted on or above a mounting board via a bonding member, the light-emitting device is disposed in some cases such that a lateral surface connecting an upper surface and a lower surface in the light-emitting device faces an upper surface of the mounting board due to restrictions on the size of an application device incorporating the mounting board or the dimension of the mounting board to form a side-view light-emitting device. In this case, the light-emitting device according to Japanese Patent Publication No. 2014-110333 may be caused to be inclined by pulling of the bonding member that is in contact with the lower surface (a back surface) of the light-emitting device.

One object of certain embodiments of the present invention is to provide a light-emitting device that has a desired orientation when the device is mounted on or above a mounting board or the like.

A light-emitting device according to one embodiment of the present invention has an upper surface that serves as a light-emitting surface, a lower surface opposite to the upper surface, and a first lateral surface that is adjacent and orthogonal to the upper surface, the first lateral surface serving as a mounting surface. The light-emitting device includes a first metal and a second metal. The first and second metals are provided respectively in a pair. The pair of first metal films is located on the lower surface, and the pair of second metal films is located on the first lateral surface. The second metal film has a larger area than an area of the first metal film.

A light-emitting device according to one embodiment of the present invention has an upper surface that serves as a light-emitting surface, a lower surface opposite to the upper surface, a first lateral surface that is adjacent and orthogonal to the upper surface, and a second lateral surface opposite to the first lateral surface, the first lateral surface serving as a mounting surface. The light-emitting device includes metal films on the lower surface and the first lateral surface. The metal films are provided for contacting a bonding member. The metal films include a first metal film and a second metal film. The first and second metal films are provided respectively in a pair. The pair of first metal films is located on the lower surface and the pair of second metal films is located on the first lateral surface. The second metal film has a length in a direction from the lower surface to the upper surface. The length of the second metal film is longer than a length of the first metal film in a direction from the first lateral surface to the second lateral surface.

Certain embodiments of the present invention can provide a light-emitting device that has a desired orientation when the device is mounted on or above a board such as the mounting board.

DETAILED DESCRIPTION

Figure 1A:
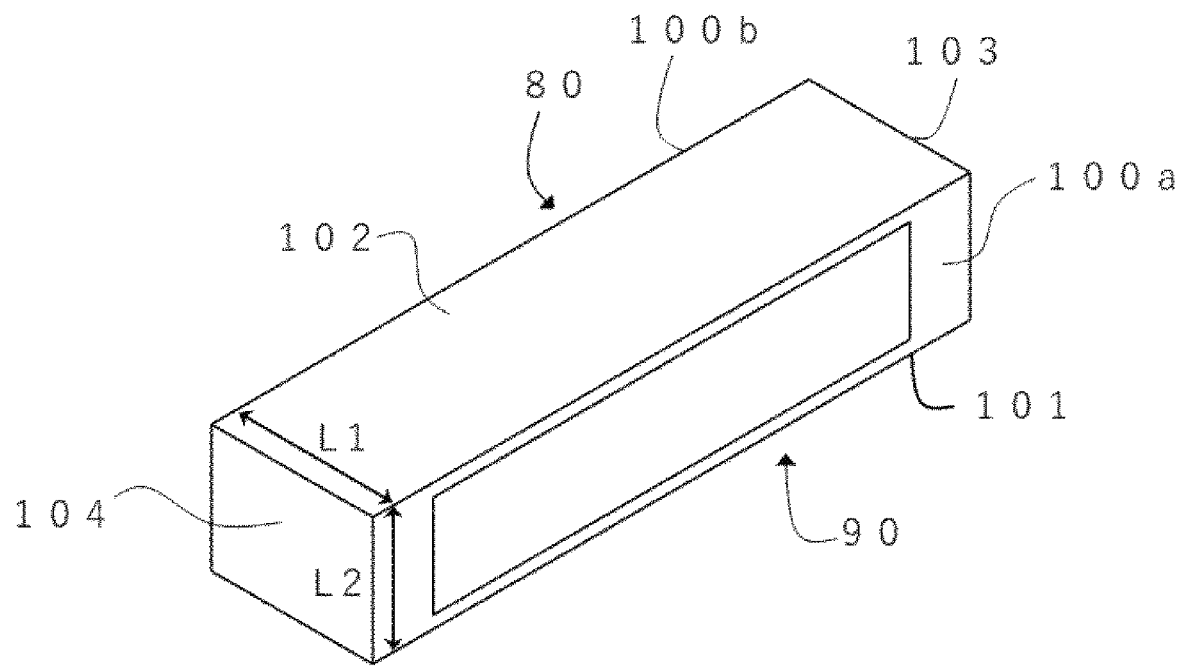
FIG. 1A is a schematic perspective view of a light-emitting device according to an embodiment of the present invention.

Embodiments of the present disclosure will be described below referring to the accompanying drawings. The following embodiments are illustrative, and the light-emitting device according to the present disclosure is not limited to the following embodiments. For example, the numerical values, shapes, materials, and the like, shown in the following embodiments are only an example and may be modified unless such a modification is technically inconsistent.

The dimensions, shapes, and the like of the components shown in the drawings may be exaggerated for ease of explanation, and may not represent the dimension, the shape, and the size relationship between components in an actual light-emitting device. The illustration of the components may be partly omitted to inhibit the drawings from being too complicated.

In the following description, the components having substantially the same function will be shown with the same reference numerals, and descriptions may be omitted. In the following description, terms representing particular directions or positions (e.g., "upper", "lower", "right" and "left", and other terms including these words) may be used. These terms are used merely for the sake of ease of explanation, representing relative directions and relative positions in the reference drawings. As far as the relative directions or positions, other drawings, actual products and manufacturing equipment may not have the same arrangement as shown in the reference drawings. In the present disclosure, the terms "perpendicular" and "orthogonal" encompass a state in which two straight lines, two sides, two planes or the like have an angle of about 90°±3° with respect to each other, unless otherwise specified.

Figure 1B:
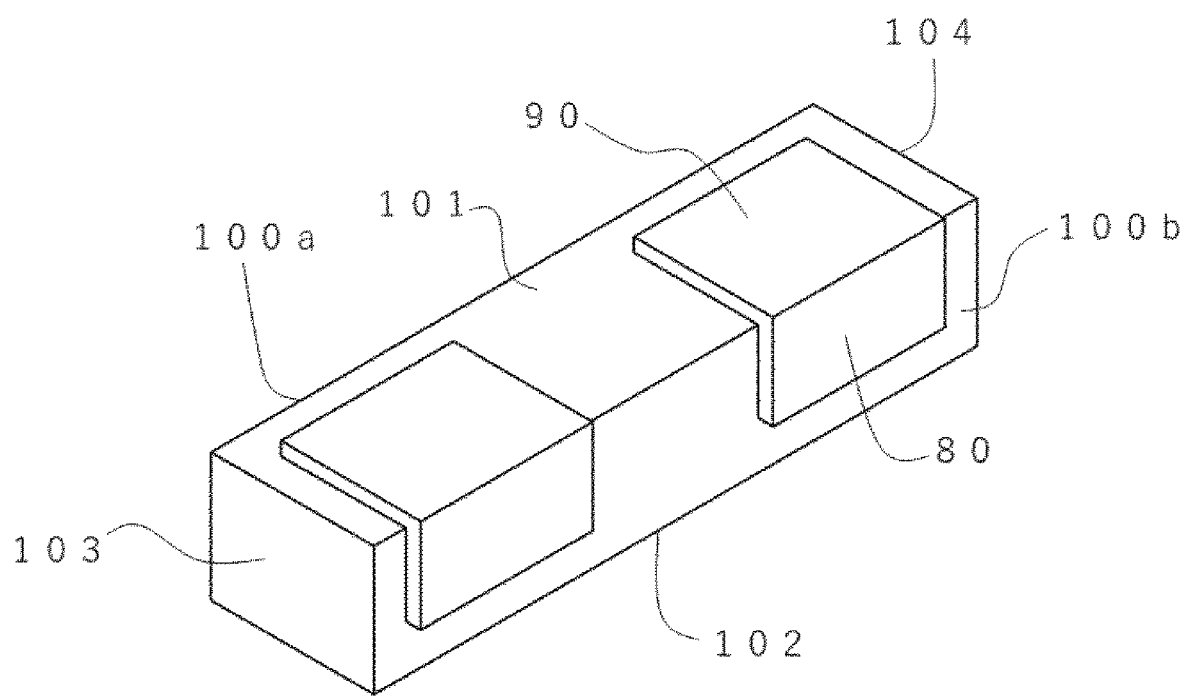
FIG. 1B is a schematic perspective view of the light-emitting device according to the embodiment of the present invention.
Figure 2A:
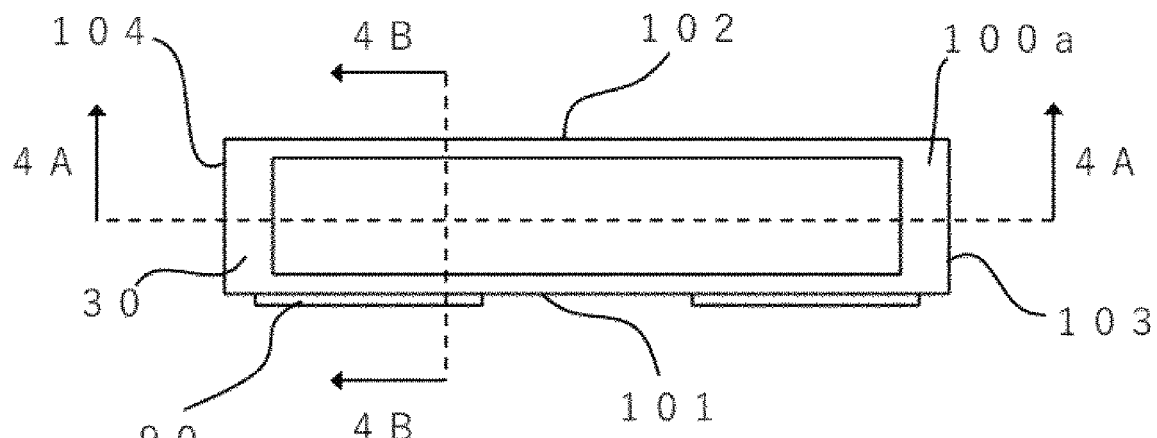
FIG. 2A is a schematic top view of the light-emitting device according to the embodiment of the present invention.
Figure 2B:
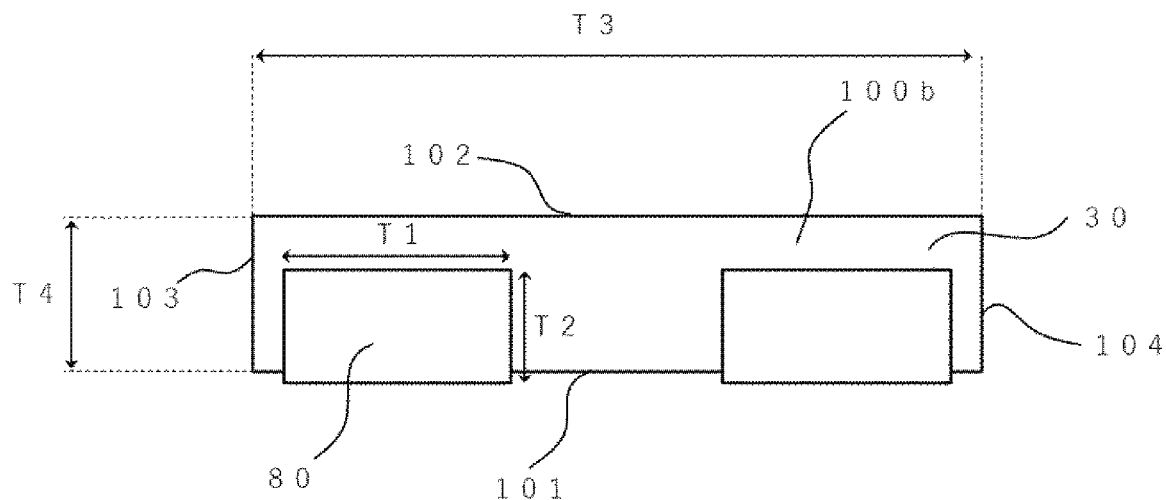
FIG. 2B is a schematic bottom view of the light-emitting device according to the embodiment of the present invention.

FIGS. 1A and 1B are schematic perspective views of a light-emitting device 100. FIG. 2A is a schematic top view of the light-emitting device 100. FIG. 2B is a schematic bottom view of the light-emitting device 100. FIGS. 2C through 2F each is a schematic side view of the light-emitting device 100.

The light-emitting device 100 includes an upper surface 100a that serves as a light-emitting surface, a lower surface 100b opposite to the upper surface 100a, and a first lateral surface 101 that is adjacent and orthogonal to the upper surface 100a. The light-emitting device 100 is a side-emission (or side-view) type device including the first lateral surface 101 that serves as a mounting surface, the first lateral surface 101 facing an upper surface of a mounting board described below.

The light-emitting device 100 has a distance L1 from the upper surface 100a to the lower surface 100b, the distance L1 being preferably larger than a distance L2 from the first lateral surface 101 to a second lateral surface 102. This allows for stable mounting of the light-emitting device 100 having the first lateral surface 101 that serves as the mounting surface. In the light-emitting device 100 disposed on or above the mounting board, the upper surface 100a of the light-emitting device 100 serves as a front surface, the lower surface 100b of the light-emitting device 100 serves as a back surface, and the first lateral surface 101 of the light-emitting device 100 serves as a bottom surface. Hence, in the light-emitting device 100 disposed on or above the mounting board, the upper surface 100a, the lower surface 100b, and the first lateral surface 101 may be referred to as the front surface 100a, the back surface 100b, and the bottom surface 101, respectively.

The light-emitting device 100 as illustrated in FIGS. 1A and 1B further includes a second lateral surface 102 opposite to the first lateral surface 101, a third lateral surface 103, and a fourth lateral surface 104 opposite to the third lateral surface 103.

The light-emitting device 100 includes a pair of first metal films 80 on the lower surface 100b and a pair of second metal films 90 on the first lateral surface 101. The pair of first metal films 80 and the pair of second metal films 90 have electrically-conductivity and serve as external electrodes. When the light-emitting device 100 is mounted on or above the mounting board using a bonding member such as solder, the bonding member is in contact with both the first metal film 80 and the second metal film 90. In addition to the bonding member, the light-emitting device 100 and the mounting board may be bonded via an adhesive member such as epoxy resin described later.

As shown in FIG. 2B, the lower surface 100b includes the pair of first metal films 80. In FIG. 2B, only a light-reflective member 30 and the pair of first metal films 80 are exposed on the lower surface 100b from the light-reflective member 30. The light-reflective member 30 may include, for example, a resin member such as an epoxy resin and a silicone resin. With the pair of first metal films 80 disposed on the lower surface 100b, heat generated by a light-emitting element 20 is efficiently dissipated from the lower surface 100b.

As seen from the lower surface, the first metal film 80 is preferably separated from the second lateral surface 102. With this configuration, when the light-emitting device 100 is mounted on or above the mounting board via a bonding member such as solder, a possible tombstone phenomenon of the light-emitting device 100 is reduced, and a possible placement of the light-emitting device 100 with its upper surface 100a, serving as the light-emitting surface of the light-emitting device 100, being inclined is reduced.

The first metal film 80 may extend to the second lateral surface 102. In this case, for example, an end of the first metal film 80 may align with an end of the second lateral surface 102. Also, a portion of the first metal film 80 may be formed on the second lateral surface 102 in addition to the lower surface 100b. This improves heat dissipation of the light-emitting device 100.

As seen from the lower surface, the first metal film 80 is preferably separated from the third lateral surface 103 and the fourth lateral surface 104. This configuration inhibits the bonding member from flowing beyond the third lateral surface 103 and the fourth lateral surface 104 when the light-emitting device 100 is mounted on or above the mounting board using the bonding member. As a result, a mounting area of the light-emitting device 100 including the bonding member is reduced. If a plurality of light-emitting devices disposed on or above the mounting board are used for, for example, a light source of an edge-type liquid crystal display device, a dim portion easily occurs between the light-emitting devices. When a plurality of light-emitting devices 100, in which the first metal film 80 is disposed as described above, are disposed on or above a mounting board such that the third lateral surface 103 of one of the light-emitting devices faces the fourth lateral surface 104 of the corresponding adjacent light-emitting device, however, the distance between the light-emitting devices can be reduced. This configuration can decrease dim portions between the light-emitting devices. Chipping or deformation due to external force easily occurs at a corner of the light-emitting device 100 that includes a connecting portion that connects a surface, such as the third lateral surface 103, and the lower surface 100b. When the first metal film 80 is separated from the third lateral surface 103 and the like, however, even if an external force is applied to a corner of the light-emitting device 100, a possible effect of the external force on the first metal film 80 is also reduced.

The first metal film 80 may extend to the third lateral surface 103 and the fourth lateral surface 104. In this case, for example, an end of the first metal film 80 may align with an end of the third lateral surface 103 and the fourth lateral surface 104. Also, a portion of the first metal film 80 may be formed on the third lateral surface 103 and the fourth lateral surface 104 in addition to the lower surface 100b. This improves heat dissipation of the light-emitting device 100.

As shown in FIG. 2B, a length T1 of the first metal film 80 in a direction from the third lateral surface 103 to the fourth lateral surface 104 (hereinafter referred to as a first direction) is preferably longer than a length T2 of the first metal film 80 in a direction from the first lateral surface 101 to the second lateral surface 102 (hereinafter referred to as a second direction). With this configuration, when the light-emitting device 100 is mounted on or above the mounting board via a bonding member such as solder, a possible tombstone phenomenon of the light-emitting device 100 is reduced, and a possible placement of the light-emitting device 100 with its upper surface 100a, serving as the light-emitting surface of the light-emitting device 100, being inclined is reduced. The length T in the present specification may be, for example, a longest length of lengths of a target member. The length T1 is, for example, 1.1 times to 5 times, preferably 1.5 times to 3 times the length T2. Also, the length T1 may be 0.25 times to 0.4 times a length T3 of the second lateral surface 102 in the first direction. The length T2 may be 0.2 times to 0.8 times a length T4 of the third lateral surface 103 in the second direction.

Figure 2C:
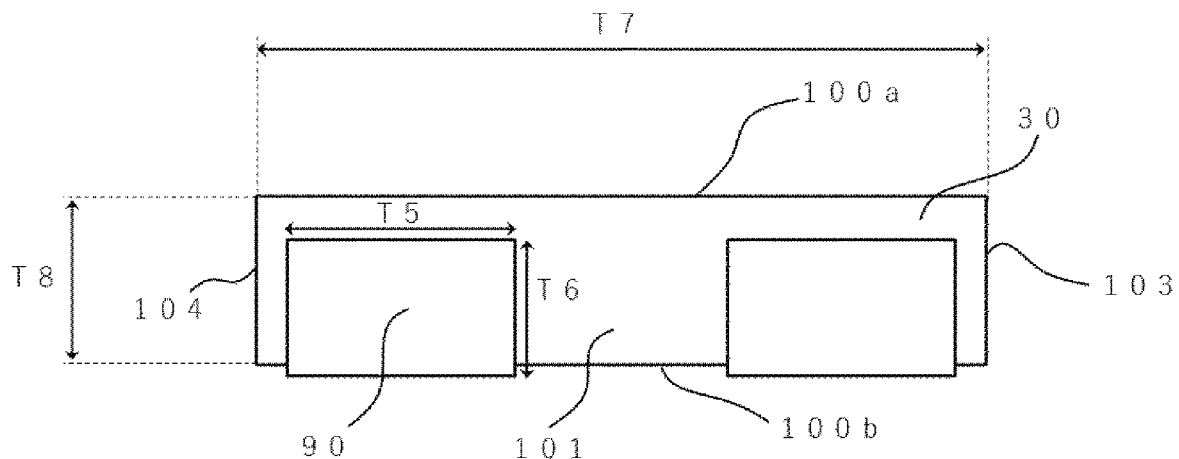
FIG. 2C is a schematic side view of the light-emitting device according to the embodiment of the present invention.
Figure 2D:
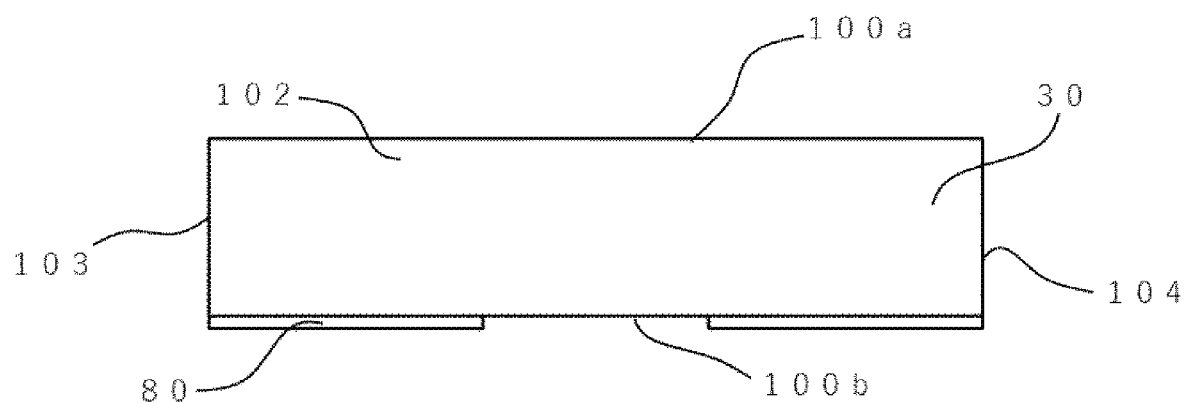
FIG. 2D is a schematic side view of the light-emitting device according to the embodiment of the present invention.
Figure 2E:
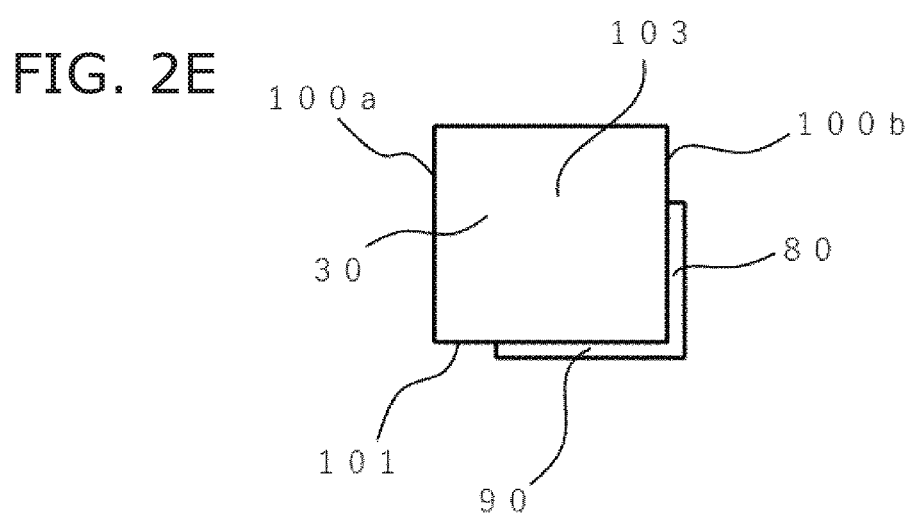
FIG. 2E is a schematic side view of the light-emitting device according to the embodiment of the present invention.
Figure 2F:
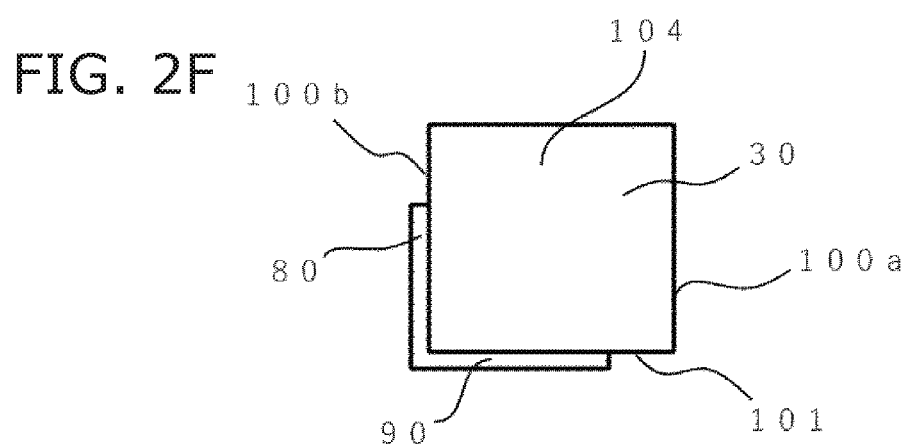
FIG. 2F is a schematic side view of the light-emitting device according to the embodiment of the present invention.

As shown in FIG. 2C, the first lateral surface 101 includes the pair of second metal films 90. In FIG. 2C, only the light-reflective member 30 and the pair of second metal films 90 are exposed on the first lateral surface 101 from the light-reflective member 30. With the pair of second metal films 90 disposed on the first lateral surface 101, heat generated in the light-emitting element 20 is efficiently dissipated from the first lateral surface 101.

The second metal film 90 is preferably separated from the upper surface 100a when the light-emitting device 100 is viewed from the first lateral surface 101. This configuration inhibits the bonding member from flowing onto the upper surface 100a that serves as the light-emitting surface when the light-emitting device 100 is mounted on or above the mounting board using the bonding member. As a result, possible cut-off or the like of light emitted from the light-emitting device 100 by the bonding member can be reduced.

The second metal film 90 may extend to the upper surface 100a. In this case, for example, an end of the second metal film 90 may align with an end of the upper surface 100a. Also, a portion of the second metal film 90 may be formed on the upper surface 100a in addition to the first lateral surface 101. This improves heat dissipation of the light-emitting device 100.

The second metal film 90 is preferably separated from the third lateral surface 103 and the fourth lateral surface 104 when the light-emitting device 100 is viewed from the first lateral surface 101. This can inhibit the bonding member from flowing beyond the third lateral surface 103 and the fourth lateral surface 104 when the light-emitting device 100 is mounted on or above the mounting board using the bonding member. As a result, the mounting area of the light-emitting device 100 including the bonding member is reduced. If a plurality of light-emitting devices disposed on or above the mounting board are used for, for example, a light source of an edge-type liquid crystal display device, a dim portion easily occurs between the light-emitting devices. When a plurality of light-emitting devices 100, in which the second metal film 90 is disposed as described above, are disposed on or above a mounting board such that the third lateral surface 103 of one of the light-emitting devices faces the fourth lateral surface 104 of the corresponding adjacent light-emitting device, however, the distance between the light-emitting devices can be reduced. This configuration can decrease dim portions between the light-emitting devices. Chipping or deformation due to external force easily occurs at a corner of the light-emitting device 100 that includes a connecting portion that connects a surface, such as the third lateral surface 103, and the first lateral surface 101. When the second metal film 90 is separated from the third lateral surface 103 and the like, however, even if an external force is applied to a corner of the light-emitting device 100, a possible effect of the external force on the second metal film 90 is also reduced.

The second metal film 90 may extend to the third lateral surface 103 and the fourth lateral surface 104. In this case, for example, an end of the second metal film 90 may align with an end of the third lateral surface 103 and the fourth lateral surface 104. Also, a portion of the second metal film 90 may be formed on the third lateral surface 103 and the fourth lateral surface 104 in addition to the first lateral surface 101. This improves heat dissipation of the light-emitting device 100.

As shown in FIG. 2C, a length T5 of the second metal film 90 in the first direction is preferably longer than a length T6 of the second metal film 90 in a direction from the upper surface 100a to the lower surface 100b (hereinafter referred to as a third direction). With this configuration, when the light-emitting device 100 is mounted on or above the mounting board via a bonding member such as solder, a possible tombstone phenomenon of the light-emitting device 100 is reduced, and a possible placement of the light-emitting device 100 with its upper surface 100a, serving as the light-emitting surface of the light-emitting device 100, being inclined is reduced. Also, as the length T5 of the second metal film 90 in the first direction is long, the bonding area to the bonding member is increased. This configuration can increase fixing force of the light-emitting device 100. The length T5 is, for example, 1.1 times to 5 times, preferably 1.5 times to 3 times the length T6. Also, the length T5 may be 0.2 times to 0.4 times a length T7 of the upper surface 100a in the first direction. The length T6 may be 0.4 times to 0.85 times a length T8 of the third lateral surface 103 in the third direction.

The first metal film 80 and the second metal film 90 are formed to satisfy any one of a first through a third condition described below. Any one of, or two of, or all three of the first through the third conditions may be satisfied.

In the first condition, the second metal film 90 has a larger area than an area of the first metal film 80. In other words, the second metal film 90 has a larger region that may come in contact with the bonding member than a region of the first metal film 80 that may come in contact with the bonding member. This configuration can inhibit the light-emitting device 100 from being inclined as caused by pulling of the bonding member that is in contact with the lower surface 100b (the back surface 100b) when the light-emitting device 100 is mounted on or above the mounting board using the bonding member. The second metal film 90 has, for example, an area of 1.15 times to 6 times, preferably 1.4 times to 2.9 times the area of the first metal film 80. This can effectively reduce possible inclination of the light-emitting device 100 caused by pulling of the bonding member.

In a modification of the first condition, for example, in the case in which a resist film or the like is disposed on a surface of the first metal film 80 and/or the second metal film 90, the area of the first metal film 80 and the like may be replaced by an area of the first metal film 80 and the like that is exposed on the outer surface.

In the second condition, the length T6 of the second metal film 90 in the third direction is longer than the length T2 of the first metal film 80 in the second direction. This configuration allows the region of the second metal film 90 that may come in contact with the bonding member, to come in contact with the bonding member along a longer distance than the region of the first metal film 80 that may come in contact with the bonding member. The configuration thus can inhibit the light-emitting device 100 from being inclined as caused by pulling of the bonding member that is in contact with the lower surface 100b (the back surface 100b) when the light-emitting device 100 is mounted on or above the mounting board using the bonding member. The length T6 of the second metal film 90 in the third direction is, for example, 1.15 times to 6 times, preferably 1.4 times to 2.9 times the length T2 of the first metal film 80 in the second direction. This can effectively inhibit possible inclination of the light-emitting device 100 caused by pulling of the bonding member.

In the third condition, when the light-emitting device 100 is mounted on or above the mounting board using the bonding member, the region of the second metal film 90 that comes in contact with the bonding member has a larger area than an area of the region of the first metal film 80 that comes in contact with the bonding member. This can inhibit the light-emitting device 100 from being inclined as caused by pulling of the bonding member that is in contact with the lower surface 100b (the back surface 100b) when the light-emitting device 100 is mounted on or above the mounting board using the bonding member. The region of the second metal film 90 that comes in contact with the bonding member has an area of, for example, 1.15 times to 6 times, preferably 1.4 times to 2.9 times the area of the region of the first metal film 80 that comes in contact with the bonding member. This can effectively inhibit possible inclination of the light-emitting device 100 caused by pulling of the bonding member.

In the light-emitting device 100 shown in FIG. 1B and the like, the first metal film 80 and the second metal film 90 are continuously disposed. This configuration can increase solder wettability of the connecting portion that connects the first metal film 80 and the second metal film 90 and can inhibit possible forming of air bubbles between the first metal film 80 and the second metal film 90 when the light-emitting device 100 is mounted on or above the mounting board using the bonding member such as solder. This configuration can efficiently dissipate heat generated in the light-emitting element 20.

Figure 3A:
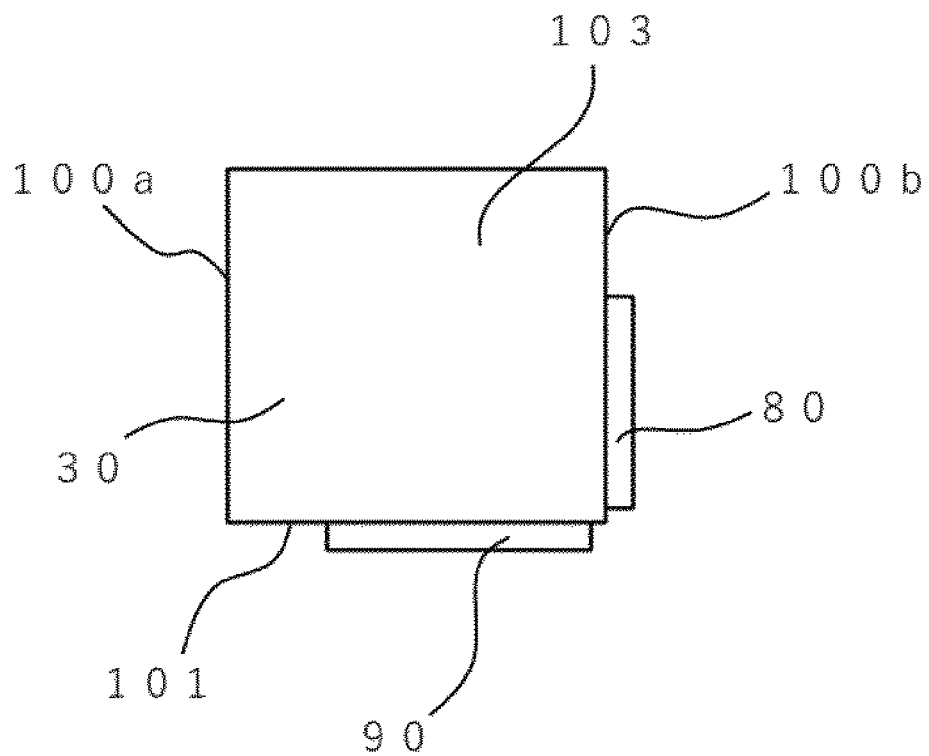
FIG. 3A is a schematic side view of a layout of a first metal film and a second metal film.
Figure 3B:
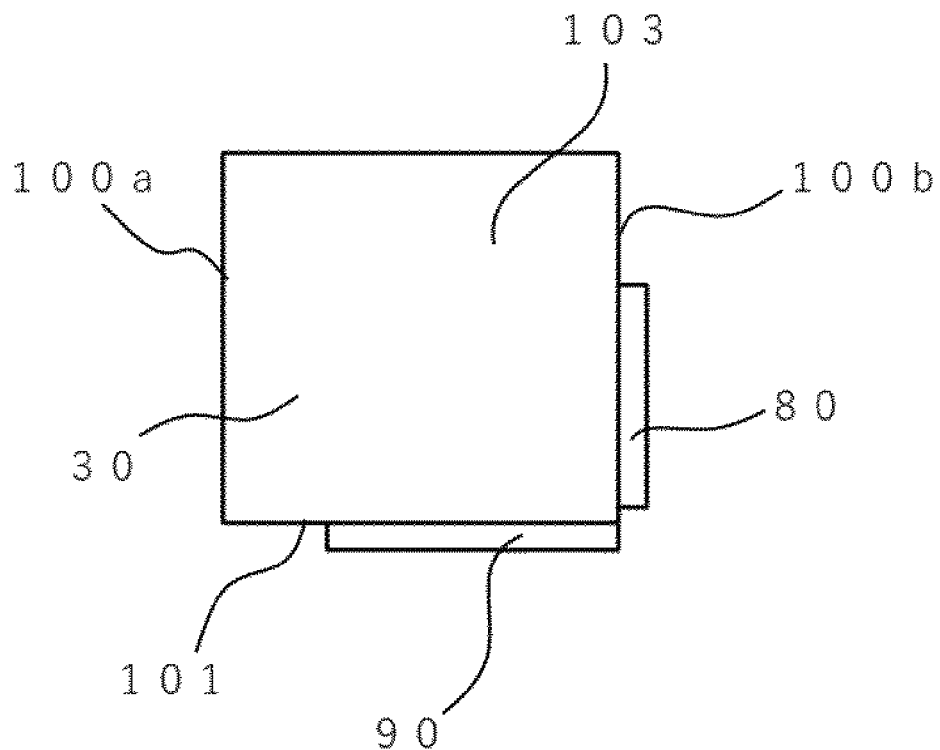
FIG. 3B is a schematic side view of a layout of a first metal film and a second metal film.

In the light-emitting device according to the present disclosure, the first metal film 80 may be disposed separately from the second metal film 90. Chipping or deformation due to external force easily occurs at a corner of the light-emitting device 100 that includes a connecting portion that connects the first lateral surface 101 and the lower surface 100b. When the first metal film 80 is separated from the second metal film 90, however, even if an external force is applied to a corner of the light-emitting device 100, a possible effect of the external force on the first metal film 80 and the second metal film 90 is also reduced. As shown in FIG. 3A, both the first metal film 80 and the second metal film 90 may be separated from the connecting portion that connects the first lateral surface 101 and the lower surface 100b. As shown in FIG. 3B, only one of the first metal film 80 or the second metal film 90 may be separated from the connecting portion that connects the first lateral surface 101 and the lower surface 100b. The separation distance between the first metal film 80 and the second metal film 90 at the connecting portion that connects the first lateral surface 101 and the lower surface 100b has, for example, a distance of half or less of a thickness of the bonding member (for example, solder) in a block shape before melting. Also, the first metal film 80 and the second metal film 90 may have a portion overlapping each other.

The first metal film 80 and the second metal film 90 may be formed by ALD, CVD, sputtering, plating, an electrically-conductive paste, vapor deposition, or the like. Also, the first metal film 80 and the second metal film 90 preferably contain a metal with a high melting point such as Ru, Mo, and Ta. This can effectively increase heat resistance of the first metal film and the like. When the first metal film 80 and the second metal film 90 are formed of a plurality of metal layers and a metal with a high melting point, such as those described above, is placed inside the outermost surface layers of the first metal film 80 and the like, Sn contained in solder can be inhibited from diffusing into the light-emitting device. Each of the first metal film 80 and the second metal film 90 has, for example, a layered structure that includes metals such as Ni/Ru/Au and Ti/Pt/Au. Also, a metal layer containing a metal with a high melting point such as Ru preferably has a thickness of about 10 Å to 1000 Å.

Figure 4A:
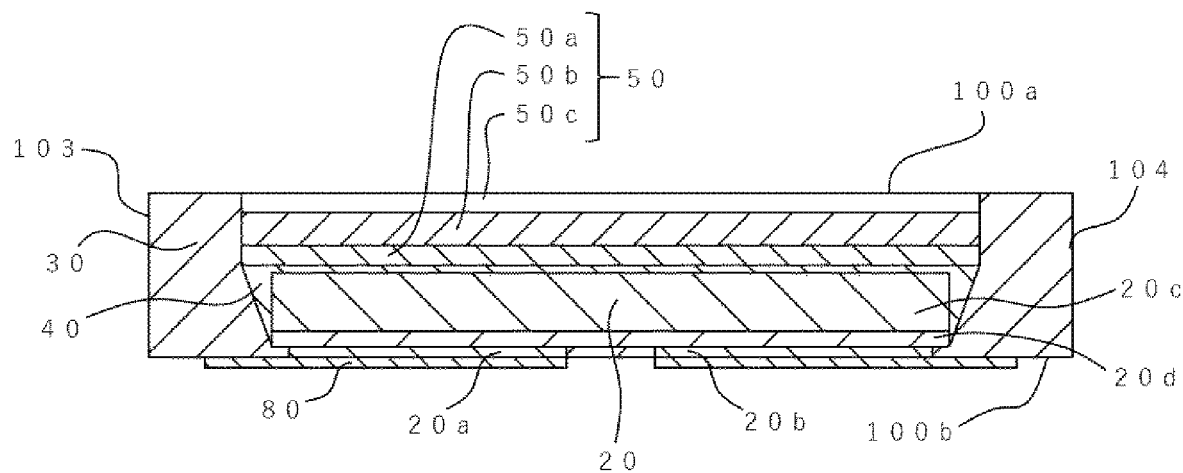
FIG. 4A is a schematic end view taken along a line 4A-4A in FIG. 2A.
Figure 4B:
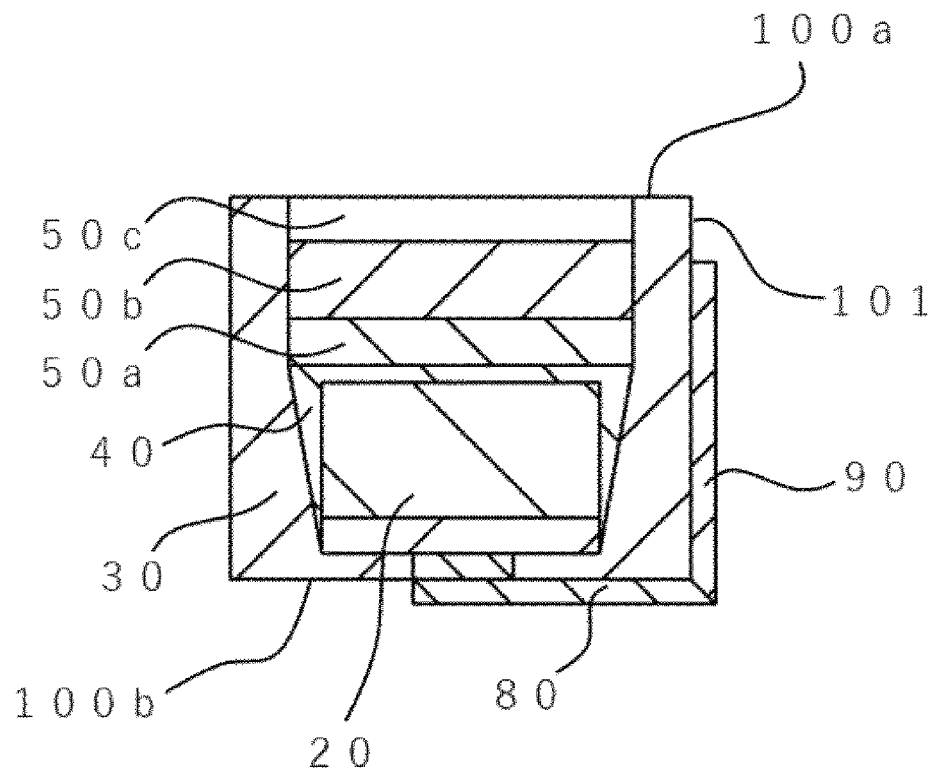
FIG. 4B is a schematic end view taken along a line 4B-4B in FIG. 2A.

An example of an inner structure of the light-emitting device 100 is shown in FIGS. 4A and 4B. FIG. 4A is a schematic end view taken along a line 4A-4A in FIG. 2A. FIG. 4B is a schematic end view taken along a line 4B-4B in FIG. 2A. The light-emitting device 100 shown in FIGS. 4A and 4B includes a light-emitting element 20, a light-transmissive member 50 disposed on an upper surface of the light-emitting element 20, a light-guiding member 40 disposed on a lateral surface of the light-emitting element 20, and a light-reflective member 30 that covers an external surface of the light-guiding member 40. The light-transmissive member 50 includes a wavelength conversion layer 50a that contains wavelength conversion particles, a wavelength conversion layer 50b that contains wavelength conversion particles, and a transparent layer 50c that contains substantially no wavelength conversion particles.

The light-emitting device 100 includes the light-emitting element 20 that has a first electrode 20a and a second electrode 20b. In the light-emitting device 100 shown in FIGS. 4A and 4B, the light-emitting element 20 includes the first electrode 20a and the second electrode 20b on one of surfaces of the light-emitting element 20. The lower surfaces of the first electrode 20a and the second electrode 20b are respectively bonded to the upper surfaces of the pair of first metal films 80. In other words, the light-emitting element 20 is disposed such that the lower surfaces of the first electrode 20a and the second electrode 20b face the respective upper surfaces of the pair of first metal films 80. The light-emitting element 20 may include a growth substrate 20c and a semiconductor layered body 20d.

The light-guiding member 40 covers a lateral surface of the light-emitting element 20 and guides light emitted from the lateral surface of the light-emitting element 20 toward the upper surface direction of the light-emitting device 100. Because the light-guiding member 40 is disposed on the lateral surface of the light-emitting element 20, a portion of light that reaches the lateral surfaces of the light-emitting element 20 is inhibited from being reflected at the lateral surfaces and attenuating inside the light-emitting element 20. In the light-emitting device 100 shown in FIGS. 4A and 4B, the light-guiding member 40 covers the upper surface in addition to the lateral surface of the light-emitting element 20. The light-guiding member 40 is, for example, a member containing a resin material as a base material. The resin material preferably includes, for example, a light-transmissive resin including a silicone resin, a silicone modified resin, an epoxy resin, and a phenolic resin. The light-guiding member 40 preferably has a high light transmittance. Hence, the light-guiding member 40 preferably contains no substance that reflects, absorbs, or scatters light. The light-guiding member 40 is selected to have a higher light transmittance for light emitted from the light-emitting element 20 than the light-reflective member 30.

The light-reflective member 30 constitutes an outer surface of the light-emitting device 100. In the light-emitting device 100 shown in FIGS. 4A and 4B, the light-reflective member 30 is disposed on all outer surfaces of the upper surface 100a, the lower surface 100b, the first lateral surface 101, the second lateral surface 102, the third lateral surface 103 and the fourth lateral surface 104. Also, the light-reflective member 30 covers the external surface of the light-guiding member 40 disposed on the lateral surface of the light-emitting element 20 and a portion of the lateral surface of the light-emitting element 20. Because the light-reflective member 30 is disposed laterally to the light-emitting element 20, light that propagates from the light-emitting element 20 in the lateral directions of the light-emitting element 20 is reflected by the light-reflective member 30, thereby, efficiently extracting light in the upward direction. The light-reflective member 30 preferably covers the lower surface of the light-emitting element 20. This allows, for example, light emitted downward from the light-emitting element 20 to be reflected upward. Also, because the light-reflective member 30 covers the lower surface of the light-emitting element 20, the adhesion strength between the light-emitting element 20 and the light-reflective member 30 can be increased.

The light-reflective member 30 is, for example, preferably selected such that a material for the light-reflective member 30 has a thermal expansion difference of ΔT40<ΔT30 when a thermal expansion difference between the light-guiding member 40 and the light-emitting element 20 (hereinafter referred to as "a first thermal expansion difference ΔT30") is compared with a thermal expansion difference between the light-reflective member 30 and the light-emitting element 20 (hereinafter referred to as "a second thermal expansion difference ΔT40"). This can inhibit the light-guiding member 40 from being detached from the light-emitting element 20.

The light-emitting device 100 may include the light-transmissive member 50 above the upper surface of the light-emitting element 20. The light-transmissive member 50 disposed above the upper surface of the light-emitting element 20 can protect the light-emitting element 20 against external stress. In the case in which the light-emitting device 100 includes the light-transmissive member 50, a lateral surface of the light-transmissive member 50 is preferably covered with the light-reflective member 30. This allows a light-emitting device to have a high contrast between a light-emitting region and a non-light-emitting region, that is, to have "good visibility."

The wavelength conversion layer 50a and the wavelength conversion layer 50b contain wavelength conversion particles. The wavelength conversion particle is a member that absorbs at least a portion of a primary light emitted from the light-emitting element 20 and emits a secondary light having a different wavelength from the primary light. The wavelength conversion layer 50a and the wavelength conversion layer 50b that contain the wavelength conversion particle output mixed light of the primary light emitted from the light-emitting element 20 and the secondary light emitted from the wavelength conversion particle.

The wavelength conversion particle may be dispersed evenly in the wavelength conversion layer 50a and the like, or may be unevenly dispersed so as to be near the light-emitting element 20 rather than the upper surface of the wavelength conversion layer 50a and the like. The wavelength conversion particle being unevenly dispersed so as to be near the light-emitting element 20 rather than the upper surface of the wavelength conversion layer 50a and the like can easily inhibit degradation of the wavelength conversion particle that is not resistant to water. Examples of the wavelength conversion particle that is not resistant to water include manganese-activated fluoride phosphors. The manganese-activated fluoride phosphors can emit light with a comparatively narrow spectral linewidth and is preferable in view of color reproductivity. The wavelength conversion particle may include a single type wavelength conversion particle or multiple types of wavelength conversion particles.

For example, the wavelength conversion layer 50a may contain manganese-activated fluoride phosphors and the wavelength conversion layer 50b may contain β-SiAlON phosphors. The wavelength conversion layer may be a single layer that contains manganese-activated fluoride phosphors and β-SiAlON phosphors.

Figure 5A:
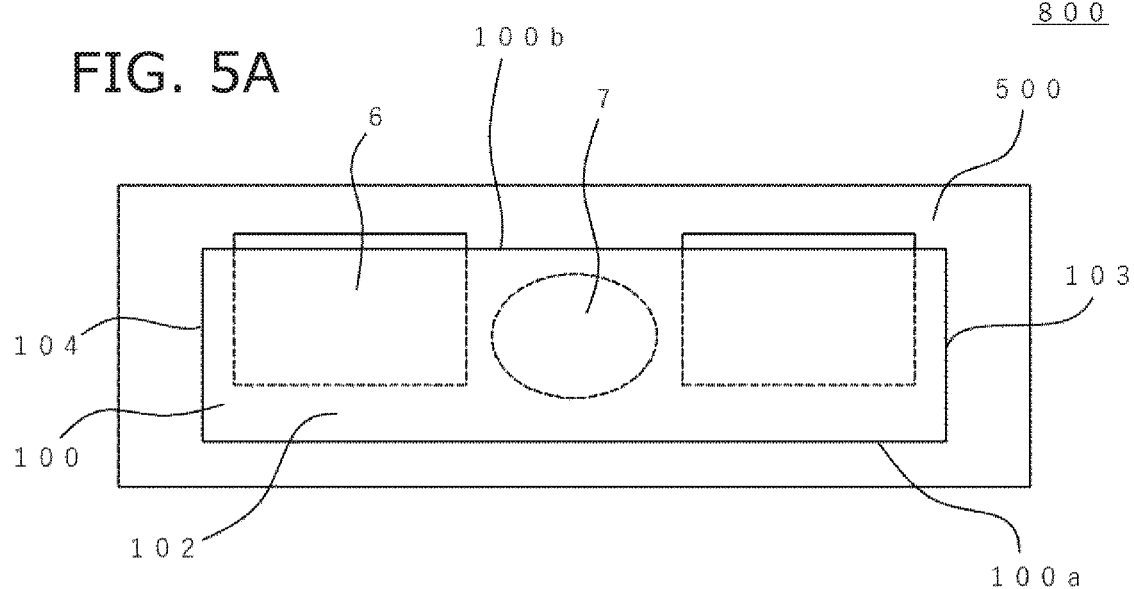
FIG. 5A is a schematic top view of a light source device according to an embodiment of the present invention.
Figure 5B:
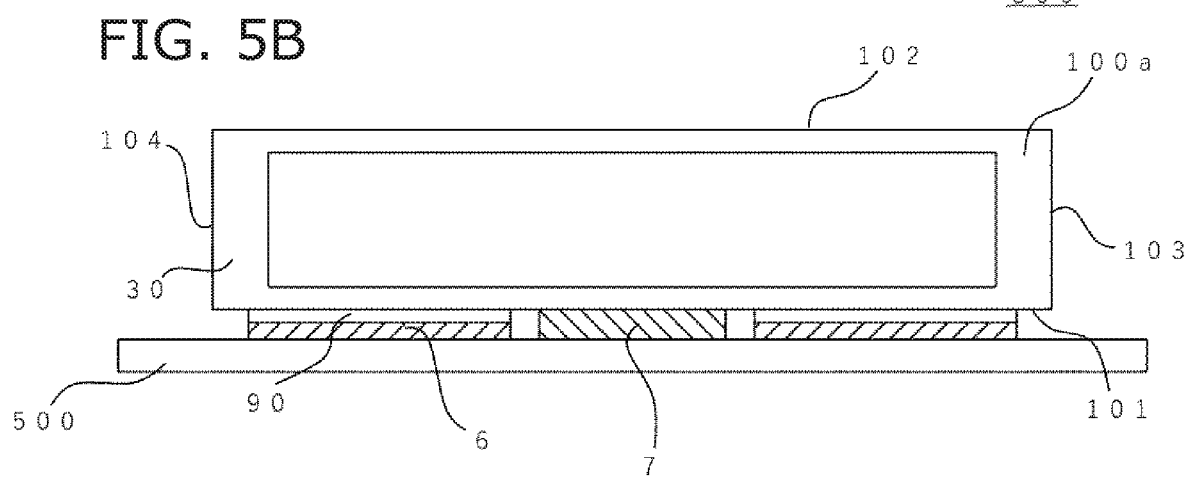
FIG. 5B is a schematic front view of a light source device according to an embodiment of the present invention.
Figure 5C:
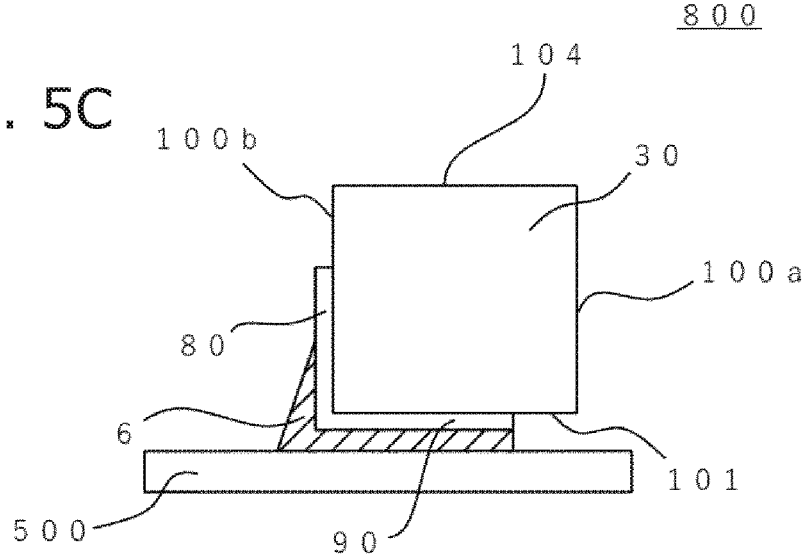
FIG. 5C is a schematic side view of a light source device according to an embodiment of the present invention.

FIG. 5A is a schematic top view of a light source device 800 that includes the light-emitting device 100 mounted on or above a mounting board 500, the light source device 800 being viewed from an upper surface (the second lateral surface 102 of the light-emitting device 100). FIG. 5B is a schematic front view of the light source device 800 viewed from a front (the upper surface 100a of the light-emitting device 100). FIG. 5C is a schematic side view of the light source device 800 viewed from a lateral surface (the fourth lateral surface 104 of the light-emitting device 100). In FIGS. 5B and 5C, a bonding member 6 and an adhesive member 7 are shown with hatching. The light-emitting device 100 is mounted on or above the mounting board 500 such that the first lateral surface 101 serves as a mounting surface.

The mounting board 500 includes a substrate material and a wiring pattern formed on the substrate material. The mounting board 500 is, for example, a long member having a longitudinal direction and a transverse direction. The mounting board 500 may include a plurality of the light-emitting devices 100. The plurality of light-emitting devices 100 are preferably disposed on or above the mounting board 500 along the longitudinal direction of the mounting board 500.

The light-emitting device 100 and the mounting board 500 are bonded mainly via the bonding member 6. The bonding member 6 is an electrically-conductive member such as solder. Further, other than the bonding member 6, the light-emitting device 100 and the mounting board 500 can be bonded using the adhesive member 7. In the light source device 800 shown in FIG. 5B, the adhesive member 7 bonds the first lateral surface 101 (the bottom surface 101) of the light-emitting device 100 and the upper surface of the mounting board 500. Use of the adhesive member 7 in addition to the bonding member 6 can further increase bonding strength between the light-emitting device 100 and the mounting board 500.

On the first lateral surface 101 (the bottom surface 101) of the light-emitting device 100, a region that is in contact with the adhesive member 7 is preferably located between one portion of the bonding member and another portion of the bonding member. This configuration can inhibit, for example, unintentional contact of one portion of the bonding member 6 with another portion of the bonding member 6 if the adhesive member 7 is an insulating adhesive member. That is, on the first lateral surface 101 (the bottom surface 101) of the light-emitting device 100, the adhesive member 7 that is insulating and disposed between two portions of the bonding member 6 can easily inhibit electrical short circuit between the terminals. The adhesive member 7 is not disposed outside the bonding member 6. This can inhibit the adhesive member 7 from flowing beyond the third lateral surface 103 and the fourth lateral surface 104. This configuration is particularly useful for the adhesive member 7 that includes a material with a lower viscosity than a material of the bonding member 6. This can decrease the mounting area of the light-emitting device 100 that includes the adhesive member 7 and the like.

The adhesive member 7 can be made of, for example, epoxy resins. Use of epoxy resins for a resin material to serve as a base material of the light-reflective member 30, for example, can increase bonding strength between the adhesive member 7 and the light-emitting device 100. On the first lateral surface 101 (the bottom surface 101) of the light-emitting device 100, the adhesive member 7 may be in contact with only the light-reflective member 30.

Components of the light-emitting device 100 and the light source device 800 according to an embodiment of the present invention will be described below.

First Metal Film 80, Second Metal Film 90

The first metal film 80 and the second metal film 90 serve as external electrodes of the light-emitting device 100. The first metal film 80 is located on the lower surface 100*b* of the light-emitting device 100. The second metal film 90 is located on the first lateral surface 101 of the light-emitting device 100.

The first metal film 80 and the second metal film 90 preferably have, for example, good corrosion resistance or good oxidation resistance. For example, a platinum group metal such as gold and platinum may be used for an outermost surface layer of the first metal film 80 and the second metal film 90. Particularly, the outermost surface of the first metal film 80 and the like is preferably gold that has good solderability.

The first metal film 80 and the second metal film 90 may include only a single layer made of a single material or include multiple layers made of different materials. The first metal film 80 and the second metal film 90 may be made of a layer containing gold, silver, tin, platinum, rhodium, titanium, ruthenium, molybdenum, tantalum, aluminum, tungsten, palladium, nickel, or an alloy of these metals.

The first metal film 80 and the second metal film 90 have a planar shape of rectangle, circle, elliptical, and a combination of these shapes. Also, an outer edge of the first metal film 80 and the second metal film 90 may have a shape of line, curve, or a combination of lines and curves. The first metal film 80 and the second metal film 90 may have a planar shape of, for example, L-shape or T-shape. Also, regarding the pair of first metal films 80, one of the pair of first metal films 80 may have a different shape from the other of the pair of first metal films 80. Forming each metal film into different planar shapes allows for recognition of the polarity of the light-emitting device 100. This configuration applies to the pair of second metal films 90.

The first metal film 80 and the second metal film 90 may have the same thickness or different thicknesses. If the thickness of the second metal film 90 is larger than the thickness of the first metal film 80, heat generated in the light-emitting element 20 is efficiently dissipated to the mounting board via the second metal film 90. If the thickness of the first metal film 80 is larger than the thickness of the second metal film 90, heat generated in the light-emitting element 20 is efficiently dissipated to outside via the first metal film 80. The thickness of each of the first metal film 80 and the second metal film 90 is, for example, 0.03 µm to 0.1 µm, preferably 0.05 µm to 0.08 µm.

Also, the first metal film 80 and the second metal film 90 may be made of the same material or different materials. For example, the second metal film 90 may be made of a material with a better wettability to the bonding member such as solder than the first metal film 80. This configuration enables the bonding strength between the second metal film 90 and the bonding member to become higher than the bonding strength between the first metal film 80 and the bonding member. As a result, possible inclination of the light-emitting device 100 to the first metal film 80 by pulling of the bonding member can be reduced.

The first metal film 80 and the second metal film 90 may be formed in the same step or different steps. For example, after forming the first metal film 80 by sputtering, the second metal film 90 may be formed by sputtering. In this case, the second metal film 90 may be formed to overlap a portion of the first metal film 80. This can increase solder wettability of the connecting portion that connects the first metal film 80 and the second metal film 90 and inhibit possible forming of air bubbles between the first metal film 80 and the second metal film 90 when the light-emitting device 100 is mounted on or above the mounting board via the bonding member such as solder. This configuration can efficiently dissipate heat generated in the light-emitting element 20.

Figure 6:
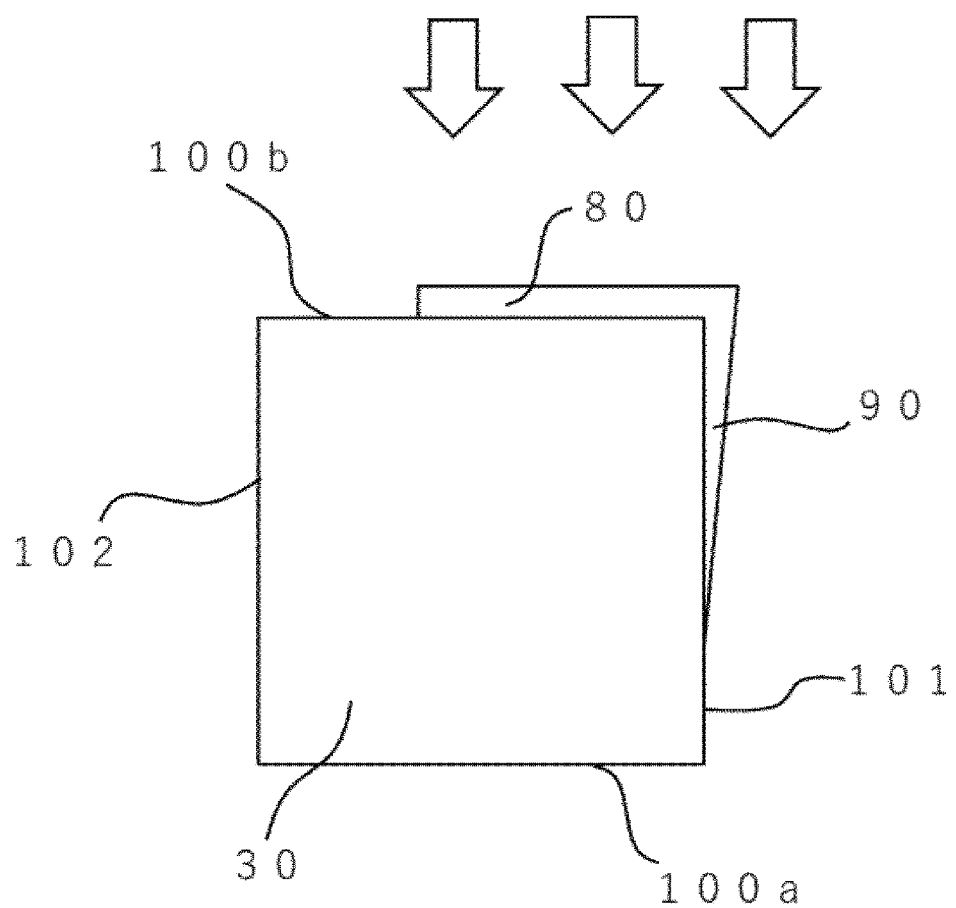
FIG. 6 is a schematic side view illustrating forming the first metal film and the second metal film.

The first metal film 80 and the second metal film 90 may be formed in the same step. Forming the first metal film 80 and the second metal film 90 simultaneously by sputtering and the like simplifies a step of metal film forming. FIG. 6 is a schematic side view of the first metal film 80 and the second metal film 90 in the case of forming by sputtering. In FIG. 6, sputtering is performed from the lower surface 100*b* (the back surface 100*b*) to form the first metal film 80 on the lower surface 100*b* and simultaneously to form the second metal film 90 on the first lateral surface 101. Hence, the first metal film 80 and the second metal film 90 are formed simultaneously. Also, the first metal film 80 can be formed on the lower surface 100*b*. The second metal film 90 may be, for example, formed such that a portion of the first lateral surface 101 apart from an upper end (a corner that connects the first lateral surface 101 and the lower surface 100*b*) is thinner than the upper end. The second metal film 90 that includes an inclined surface has a larger surface area compared to a surface area of the second metal film 90 that has a substantially same film thickness. This increases bonding strength between the bonding member and the second metal film 90. As a result, possible inclination of the light-emitting device 100 to the first metal film 80 by pulling of the bonding member can be reduced. Also, sputtering may be performed from the first lateral surface 101 to form the second metal film 90 on the first lateral surface 101 and simultaneously to form the first metal film 80 on the lower surface 100b.

Light-Emitting Element 20

The light-emitting element 20 is, for example, an LED chip. The light-emitting element 20 may have, for example, a semiconductor layered structure including a nitride semiconductor ($IN_xAl_yGa_{1-x-y}N$, $0 \leq x$, $0 \leq y$, $x+y \leq 1$) that can emit light in ultraviolet to visible range. The light-emitting element 20 preferably has a peak wavelength in a range of 400 nm to 530 nm, more preferably in a range of 420 nm to 490 nm, further preferably in a range of 450 nm to 475 nm, in view of luminous efficiency of the light-emitting device and excitation spectrum and color mixing property of the wavelength conversion particle.

The light-emitting elements may be only one, or two or more light-emitting elements may be included. In the case in which a plurality of light-emitting elements are included, the plurality of light-emitting elements may include, for example: a plurality of blue-light-emitting elements that emit blue light; three different light-emitting elements that respectively emit blue, green, or red light; or a combination of a light-emitting element that emits blue light and a light-emitting element that emits green light. In the case in which the light-emitting device 100 is used for a light source of a liquid crystal display device, the light-emitting element preferably includes: a single light-emitting element that emits blue light; two light-emitting elements that emit blue light; three or more light-emitting elements that emit blue light; or a combination of a light-emitting element that emit blue light and a light-emitting element that emits green light. Both the light-emitting element that emits blue light and the light-emitting element that emits green light preferably have a half-width of 40 nm or less, more preferably a half-width of 30 nm or less. This enables the blue light and the green light to easily have a sharp peak wavelength. Hence, for example, in the case of using the light-emitting device to serve as the light source of the liquid crystal display device and the like, the liquid crystal display device can achieve high color reproducibility. Also, the plurality of the light-emitting elements can be electrically connected in series, in parallel, or in a combination of series and parallel connections.

The light-emitting element 20 has a planer shape that is not particularly limited but may be a square, or a rectangle that has longer sides in one direction. The planar shape of the light-emitting element 20 may be a hexagon or other polygonal shape. The light-emitting element 20 includes a pair of positive and negative electrodes. The positive and negative electrodes may be made of gold, silver, tin, platinum, rhodium, titanium, aluminum, tungsten, palladium, nickel, or an alloy of these metals. The lateral surface of the light-emitting element 20 may be perpendicular to the upper surface of the light-emitting element 20 or may be inclined inward or outward.

Light-Transmissive Member 50

The light-transmissive member 50 is a member that is disposed on or above the light-emitting element 20 and protects the light-emitting element 20. The light-transmissive member 50 may be a single layer or multiple layers. In the case in which the light-transmissive member 50 includes multiple layers, the layers may have the same base material or may have different base materials.

The base material of the light-transmissive member 50 is light-transmissive to light emitted from the light-emitting element 20. The term "light-transmissive" in the present specification means that a light transmittance is 60% or more, preferably 70% or more, more preferably 80% or more, at the emission peak wavelength of the light-emitting element 20. The base material of the light-transmissive member 50 may include, for example, a silicone resin, an epoxy resin, a phenolic resin, a polycarbonate resin, an acrylic resin, or a modified resin of these resins. Also, the base material of the light-transmissive member 50 may be glass. Particularly, a silicone resin and an epoxy resin that exhibit good heat and light resistances are preferably used. Examples of silicone resins include a dimethyl silicone resin, a phenyl-methyl silicone resin, and a diphenyl silicone resin. A modified resin in the present specification includes a hybrid resin.

The light-transmissive member 50 may contain light scattering particles. The light scattering particles include silicon oxide, aluminum oxide, zirconium oxide, and zinc oxide. These materials can be used singly, or two or more of the materials can be used in combination as the light scattering particle. Particularly, silicon oxide has a small linear expansion coefficient and is preferably used. Also, nanoparticles are preferable as the light scattering particles. This can increase scattering of light emitted from the light-emitting element and decrease the use of the amount of wavelength conversion particles. The nanoparticles are particles having a particle diameter in a range of 1 nm to 100 nm. The particle diameter in the present specification is defined by D50.

The light-transmissive member 50 may contain wavelength conversion particles. The wavelength conversion particles absorb at least a portion of primary light emitted from the light-emitting element and emits secondary light that has a different wavelength from the primary light. The wavelength conversion particles can be used singly or in combination of two or more types of phosphors shown below.

Examples of wavelength conversion particles include yttrium-aluminum-garnet phosphors (for example, $Y_3(Al, Ga)_5O_{12}$:Ce), lutetium-aluminum-garnet phosphors (for example, $Lu_3(Al,Ga)_5O_{12}$: Ce), terbium-aluminum-garnet phosphors (for example, $Tb_3(Al,Ga)_5O_{12}$:Ce), silicate phosphors (for example, $(Ba,Sr)_2SiO_4$:Eu), chlorosilicate phosphors (for example, $Ca_8Mg(SiO_4)_4Cl_2$:Eu), β-SiAlON phosphors (for example, $Si_{6-z}Al_zO_zN_{8-z}$:Eu ($0<z<4.2$)), SGS phosphors (for example, $SrGa_2S_4$:Eu), alkaline-earth metal aluminate phosphors (for example, $(Ba,Sr,Ca)Mg_xAl_{10}O_{17-x}$: Eu,Mn), α-SiAlON phosphors (for example, $M_z(Si,Al)_{12}(O,N)_{16}$ (where $0<z \leq 2$, and M is Li, Mg, Ca, Y, and a lanthanoid element other than La and Ce), nitrogen-containing calcium aluminosilicate phosphors (for example, $(Sr,Ca)AlSiN_3$:Eu), manganese-activated fluoride phosphors (phosphors represented by the general formula (I) $A_2[M_{1-a}Mn_aF_6]$ (in the general formula (I), A is at least one selected from the group consisting of K, Li, Na, Rb, Cs, and $NH_4$, M is at least one element selected from the group consisting of the group IV elements and the group XIV elements, and "a" satisfies $0<a<0.2$)). Substituting a portion of Y in an yttrium-aluminum-garnet phosphor with Gd can shift its emission peak wavelength to a longer wavelength. Typical examples of the manganese-activated fluoride phosphors include manganese-activated potassium fluorosilicate phosphors (for example, $K_2SiF_6$:Mn).

A sintered body of wavelength conversion particles and an inorganic material such as alumina, or a plate-like crystal of the wavelength conversion particles can be used for the light-transmissive member 50.

The light-transmissive member 50 may include a wavelength conversion layer that contains wavelength conversion particles and a transparent layer that contains substantially no wavelength conversion particles. The transparent layer disposed on the upper surface of the wavelength conversion layer serves as a protective layer and inhibits degradation of the wavelength conversion particles in the wavelength conversion layer. The expression "contains substantially no wavelength conversion particles" means that inevitable mixture of the wavelength conversion particles is not excluded, and the content of the wavelength conversion particles is, for example, 0.05 weight % or less.

Light-Reflective Member 30

The light-reflective member 30 preferably has a light reflectivity of 70% or more, more preferably 80% or more, further preferably 90% or more, at the emission peak wavelength of the light-emitting element 20 in view of light extraction efficiency toward the upper surface direction of the light-emitting device 100. In addition, the light-reflective member 30 is preferably white. The light-reflective member 30 may contain a light-reflective substance in a resin material to serve as a base material. The light-reflective member 30 can be obtained by solidifying a liquid resin material. The light-reflective member 30 is formed by transfer molding, injection molding, compression molding, potting, or the like.

The light-reflective member 30 may contain a resin material to serve as the base material. The resin material to serve as a base material may include a thermosetting resin, a thermoplastic resin, and the like. Specifically, examples of the resin material include an epoxy resin, a silicone resin, a modified epoxy resin such as a silicone-modified epoxy resin, a modified silicone resin such as epoxy-modified silicone resin, a denatured silicone resin, an unsaturated polyester resin, a saturated polyester resin, a polyimide resin, a modified polyimide resin, a polyphthalamide (PPA), a polycarbonate resin, a polyphenylene sulfide (PPS), a liquid crystal polymer (LCP), an ABS resin, a phenolic resin, an acrylic resin, and a PBT resin. Particularly, a thermosetting resin such as an epoxy resin and a silicone resin that exhibits good heat and light resistances is preferably used as the resin material of the light-reflective member 30.

The light-reflective member 30 preferably contains a light-reflective substance in the above resin material to serve as a base material. The light-reflective substance is preferably a member that is unlikely to absorb light emitted from the light-emitting element and has a large difference in refractive index against the resin material to serve as a base material. Examples of such light-reflective substances include titanium oxide, zinc oxide, silicon oxide, zirconium oxide, aluminum oxide, and aluminum nitride.

Light-Guiding Member 40

The light-guiding member 40 covers a lateral surface of the light-emitting element 20, and guides light emitted from the lateral surface of the light-emitting element 20 toward an upper surface direction of the light-emitting device. That is, a portion of light that reaches the lateral surface of the light-emitting element 20 is reflected at the lateral surface, and attenuated inside the light-emitting element 20. The light-guiding member 40, however, can guide the light in the light-guiding member 40, thereby extracting the light outside of the light-emitting element 20. The resin material listed as examples of the light-reflective member 30 may be used as the light-guiding member 40. Particularly, as the light-guiding member 40, a thermosetting transmissive resin such as a silicone resin, a modified silicone resin, an epoxy resin, or a phenolic resin is preferably used. The light-guiding member 40 preferably has a high light transmittance. Hence, generally, the light-guiding member 40 preferably contains substantially no additives that reflect, absorb, or scatter light. The expression "contains substantially no additives" means that inevitable mixture of the additives is not excluded. The light-guiding member 40 may contain the light scattering particle and/or the wavelength conversion particle as mentioned in the light-transmissive member 50.

An epoxy resin may be selected as a resin material to serve as a base material of the light-reflective member 30, the light-guiding member 40, and the light-transmissive member 50. With the epoxy resins that has a greater strength than the silicone resin after solidifying, the strength of the light-emitting device 100 is increased. Also, use of the same resin material as the base material of each member can increase the adhesion strength of each member. Also, in the case of selecting epoxy resins as the adhesive member 7, bonding strength between the adhesive member 7 and the light-reflective member 30 can be increased.

Mounting Board 500

The mounting board 500 includes a sheet-shape base material made of glass epoxy resin, ceramic, polyimide, or the like. Also, the mounting board 500 includes a land portion and a wiring pattern made of copper, gold, silver, nickel, palladium, tungsten, chromium, titanium, or an alloy of these metals on the base material. The land portion and the wiring pattern are formed by a known method such as, for example, plating, press fitting, attaching, sputtering, vapor deposition, or etching.

Bonding Member 6, Adhesive Member 7

Any materials known in the art may be used as the bonding member 6. Specifically, the bonding member 6 may be, for example: solder such as tin-bismuth-based solder, tin-copper-based solder, tin-silver-based solder, gold-tin-based solder (specifically, alloys of Ag, Cu and Sn, Cu and Sn, and Bi and Sn as main components); eutectic alloys (such as alloys of Au and Sn, Au and Si, Au and Ge as main components); electrically-conductive pastes of silver, gold, palladium and the like; bumps; anisotropic conductive materials; brazing materials such as low-melting-point metals and the like. The resin material such as an epoxy resin that is listed as examples of the light-transmissive member 50 or the member listed in the bonding member 6 may be used as the adhesive member 7. The bonding member 6 and adhesive member 7 may be the same member or different members. In the case in which the bonding member 6 and the adhesive member 7 are different, solder as an electrically-conductive material may be selected for the bonding member 6, and a resin material such as an epoxy resin may be selected for the adhesive member 7.

Modification

Figure 7A:
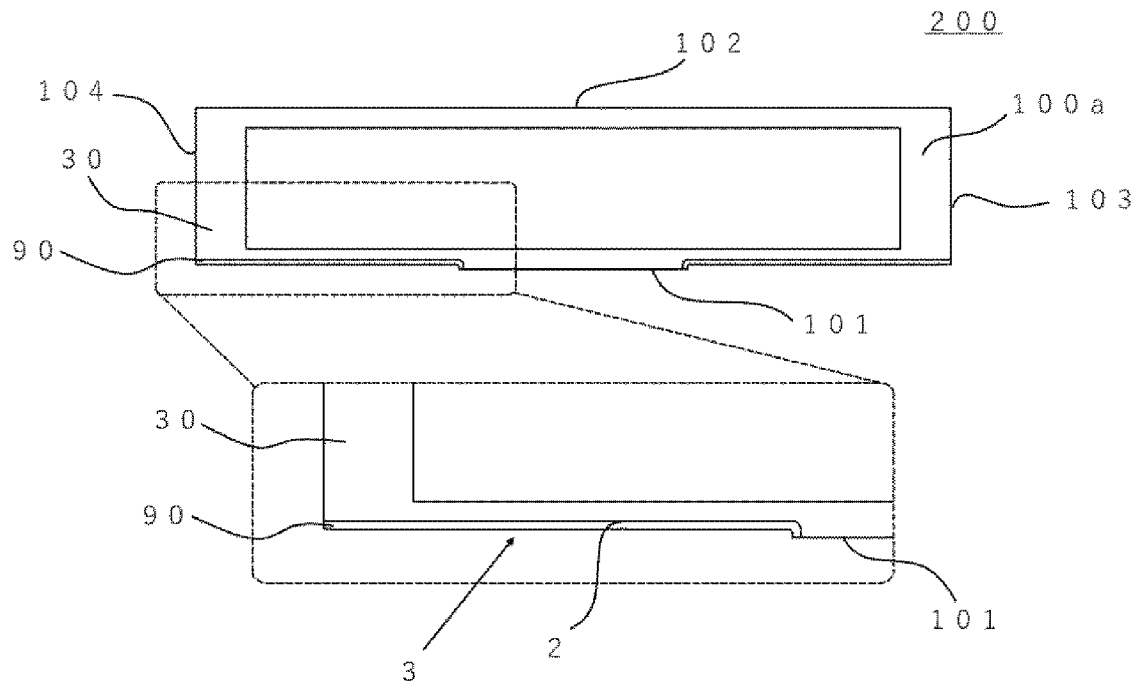
FIG. 7A is a schematic top view of a light-emitting device according to a modification of the present invention.
Figure 7B:
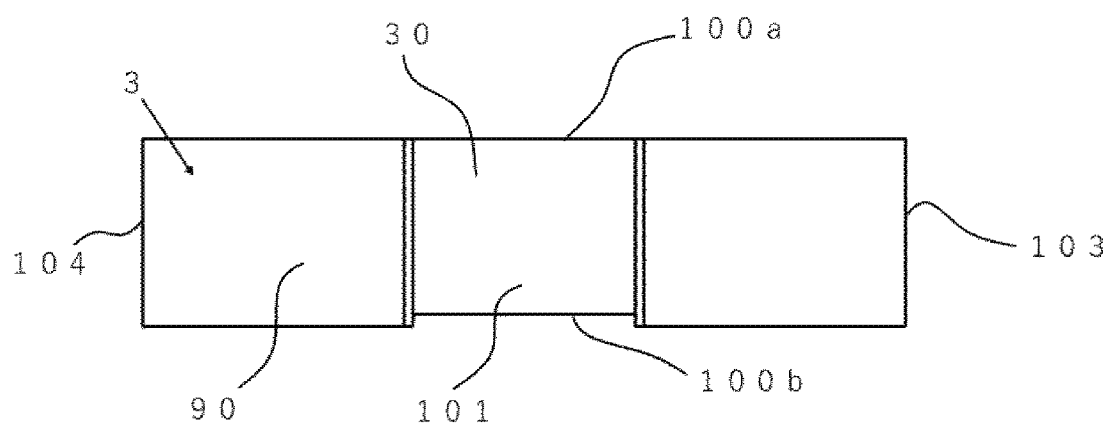
FIG. 7B is a schematic side view of the light-emitting device viewed from the first lateral surface.

FIG. 7A is a schematic top view of a light-emitting device 200 according to a modification. FIG. 7B is a schematic side view of the light-emitting device 200 viewed from the first lateral surface 101. As shown in FIGS. 7A and 7B, on the first lateral surface 101 that serves as the mounting surface, the light-reflective member 30 includes a depressed portion 2, and the second metal film 90 includes a recess 3. When the light-emitting device 200 is mounted on or above the mounting board using a bonding member such as solder, the bonding member flows into the recess 3, which increases the bonding strength of the light-emitting device 200. Forming the depressed portion 2 on the first lateral surface 101 and disposing the second metal film 90 in the depressed portion 2 can increase the adhesion area between the second metal film 90 and the light-reflective member 30. This configuration can increase adhesion strength between the second metal film 90 and the light-reflective member 30. Also, upon forming the second metal film 90 by sputtering, the recess 3 may be easily formed on the outer surface of the second metal film 90. The recess 3 on the outer surface of the second metal film 90 increases the bonding area between the second metal film 90 and the bonding member, and increases the bonding strength between the second metal film 90 and the bonding member. In other words, by forming the recess 3 on the first lateral surface 101 that serves as the mounting surface, the bonding strength between the light-emitting device 200 and the mounting board is increased when the light-emitting device 200 is mounted on or above the mounting board using the bonding member such as solder.

The light-emitting device 200 may include only one of either the depressed portion 2 or the recess 3. For example, on a flat surface of the light-reflective member 30 that does not include the depressed portion 2, the second metal film 90 that includes the recess 3 may be formed by varying the film thickness using sputtering, plating, or the like. Also, the second metal film 90 may be disposed in the depressed portion 2 of the light-reflective member 30 such that on the first lateral surface 101, a surface of the light-reflective member 30 is substantially flush with a surface of the second metal film 90. This configuration allows the second metal film 90 that has a large thickness to be easily disposed in the depressed portion 2, and increases heat dissipation of the light-emitting device 200.

Figure 7C:
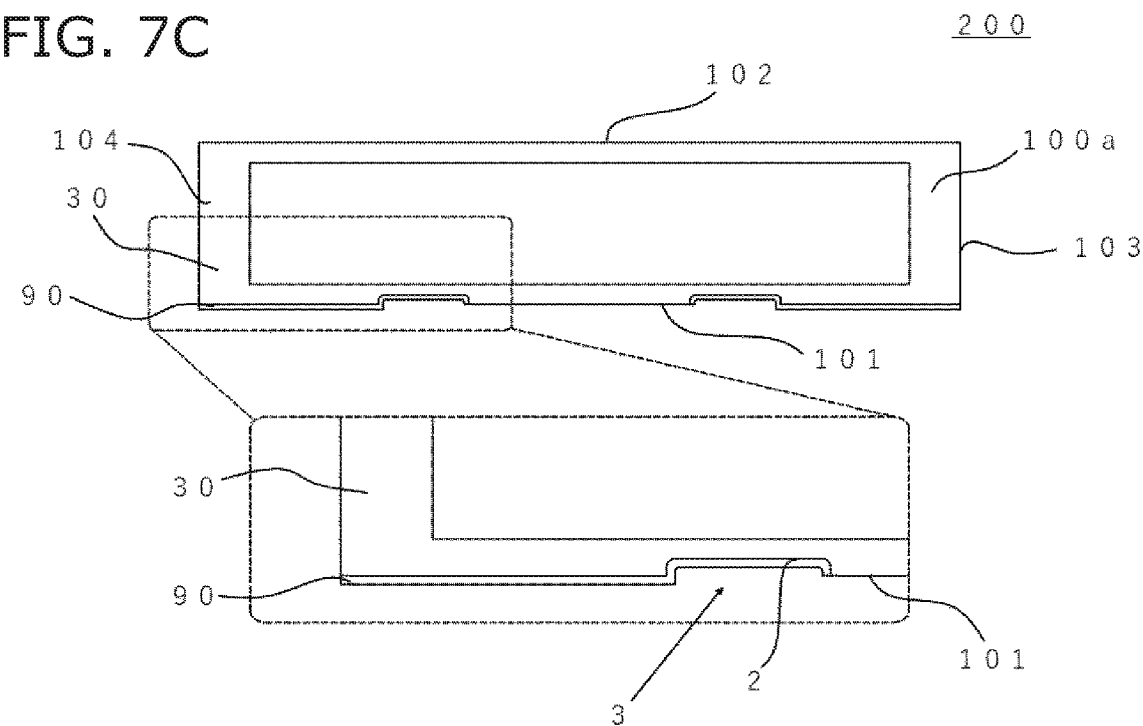
FIG. 7C is a schematic top view of a light-emitting device according to a modification of the present invention.
Figure 7D:
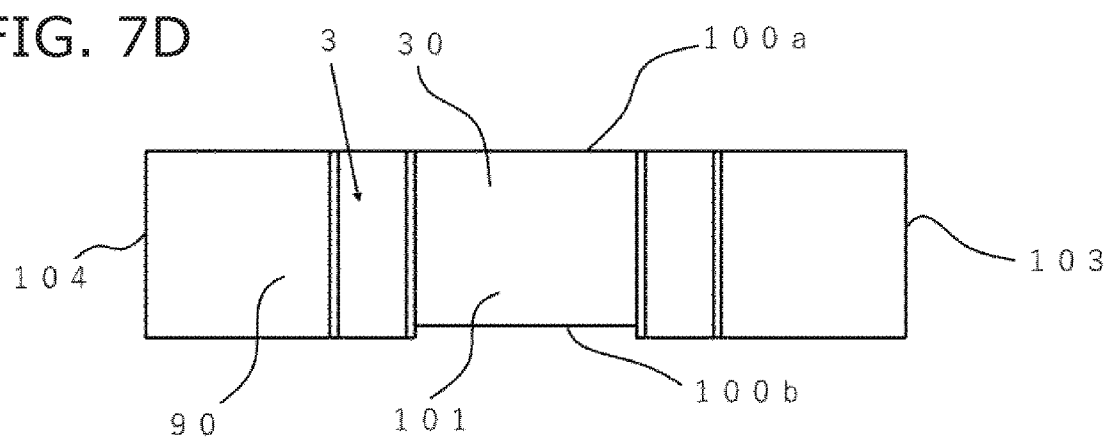
FIG. 7D is a schematic side view of the light-emitting device viewed from the first lateral surface.
Figure 7E:
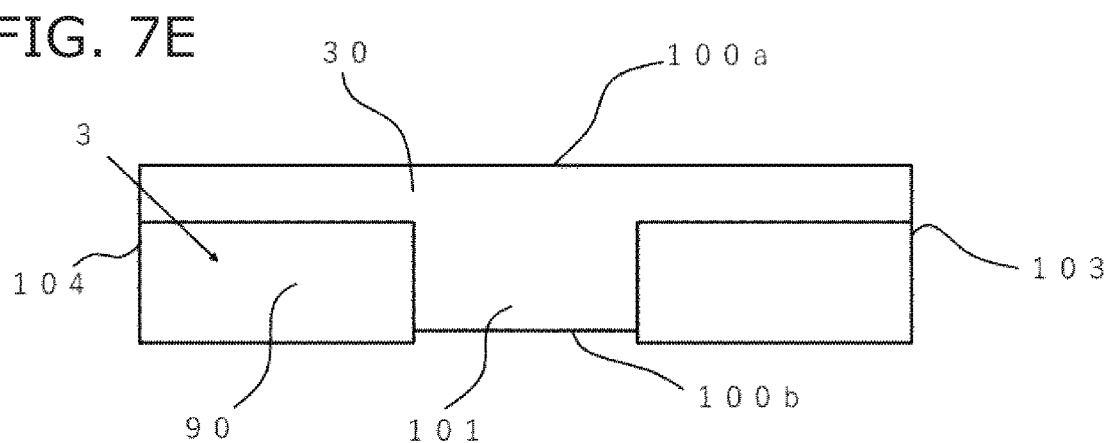
FIG. 7E is a schematic side view of a light-emitting device viewed from the first lateral surface.

In FIGS. 7A and 7B, the depressed portion 2 and the recess 3 are open at the upper surface 100a, the lower surface 100b, and either the third lateral surface 103 or the fourth lateral surface 104. Also, the second metal film 90 covers all the depressed portion 2. This configuration increases the bonding area between the second metal film 90 and the bonding member, and increases the bonding strength between the second metal film 90 and the bonding member. Note that, as shown in FIGS. 7C and 7D, the depressed portion 2 and/or the recess 3 may not be open at the third lateral surface 103 or the fourth lateral surface 104. This configuration facilitates disposition of the bonding member within the recess 3 that is located inward of the third lateral surface 103 and the fourth lateral surface 104. This can inhibit the bonding member from flowing beyond the third lateral surface 103 and the fourth lateral surface 104. Also, as shown in FIG. 7E, the depressed portion 2 and/or the recess 3 may not be open at the top surface 100a. This configuration facilitates disposition of the bonding member within the recess 3 that is located inward of the upper surface 100a, and can inhibit the bonding member from flowing onto the upper surface 100a.

Figure 8A:
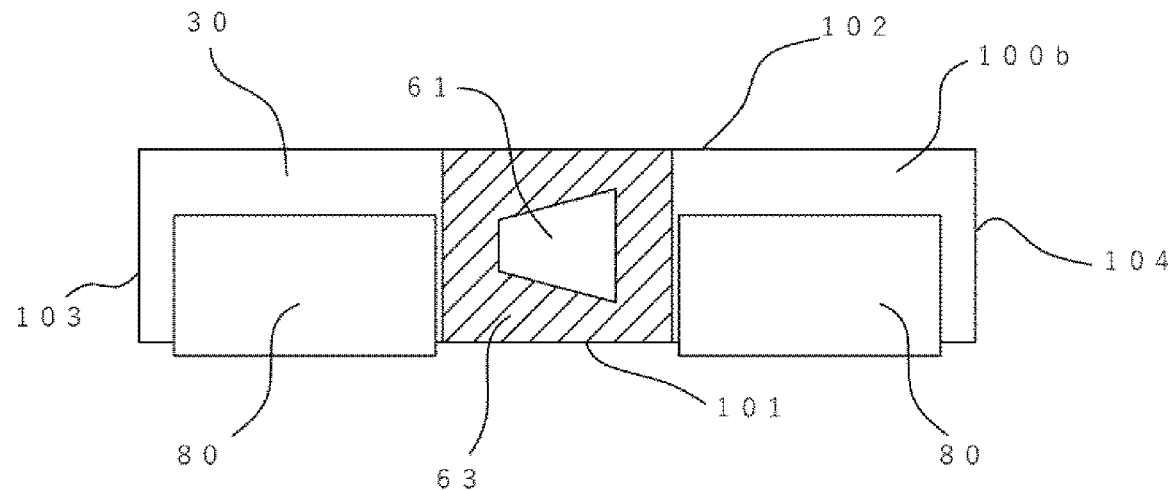
FIG. 8A is a schematic side view of a light-emitting device viewed from the first lateral surface.
Figure 8B:
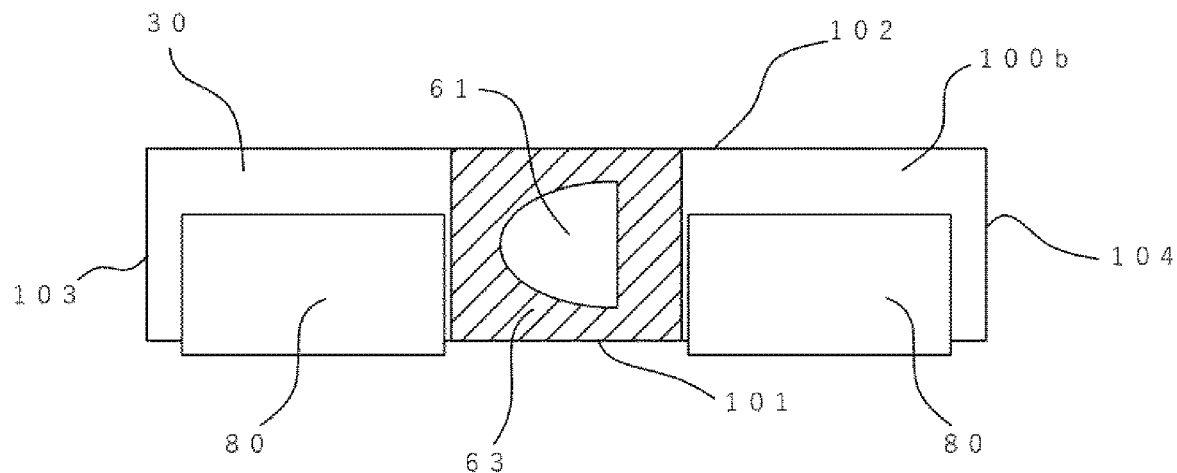
FIG. 8B is a schematic side view of a light-emitting device viewed from the first lateral surface.

Also, as shown in FIGS. 8A and 8B, a polarity recognition portion 61 that shows polarity of the pair of first metal films 80 may be formed on the lower surface 100b (the back surface 100b) of the light-emitting device 100. This configuration allows the polarities of the pair of first metal films 80 and the pair of second metal films 90 to be recognized. The polarity recognition portion 61 may be formed directly on the surface of the light-reflective member 30 between the pair of first metal films 80, or as shown in FIGS. 8A and 8B, may be formed such that a resist 63 is disposed between the pair of first metal films 80 to form the polarity recognition portion 61 on the outer surface of the resist 63. The polarity recognition portion 61 may be formed in a shape of a depressed portion, a projecting portion, or a combination of depressed portions and projecting portions. In FIGS. 8A and 8B, the region of the resist 63 is shown with hatching. The polarity recognition portion 61 may have any planar shape as long as the polarities of the metal films are recognized. In FIG. 8A, the polarity recognition portion 61 has a trapezoidal planar shape that has a short side near one side of one of the first metal films 80 and a long side near one side of the other of the first metal films 80. In FIG. 8B, the polarity recognition portion 61 has a semicircular or a semiellipsoidal planar shape that has a circular or an elliptical arc near one side of one of the first metal films 80 and a straight portion near one side of the other of the first metal films 80.

Figure 9A:
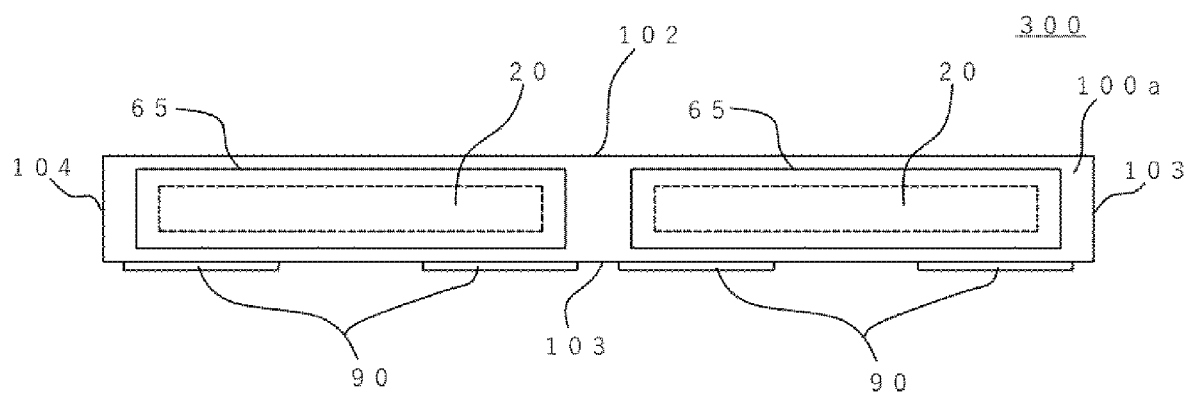
FIG. 9A is a schematic top view of a light-emitting device according to a modification of the present invention.
Figure 9B:
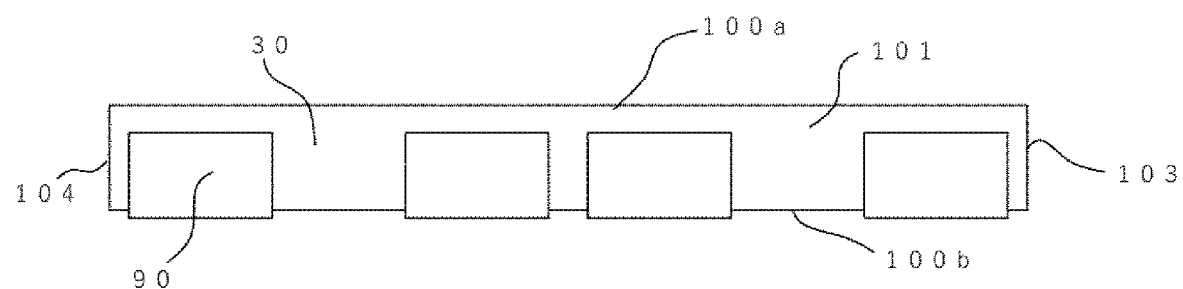
FIG. 9B is a schematic side view of a light-emitting device viewed from the first lateral surface.

Although the light-emitting device 100 that includes one light-emitting element 20 is shown in FIGS. 4A and 4B, the light-emitting device may include two or more light-emitting elements 20 as shown in FIGS. 9A and 9B. FIG. 9A is a schematic top view of a light-emitting device 300 that includes two light-emitting elements 20. FIG. 9B is a schematic side view of the light-emitting device 300 viewed from the first lateral surface 101. The light-emitting device 300 includes two light-emitting windows 65 on the upper surface 100a. The light-emitting elements 20 are respectively disposed below the light-emitting window 65 (the outer edges of the light-emitting elements 20 are shown in dashed lines). The light-emitting device that includes two or more light-emitting elements 20 can provide a bright light-emitting device. The two or more light-emitting elements 20 may include: a plurality of blue-light-emitting elements that emit blue light; three different light-emitting elements that respectively emit blue, green, or red light; or a combination of a light-emitting element that emits blue light and a light-emitting element that emits green light.

In the light-emitting device that includes two or more light-emitting elements 20, the disposition, the shape, and the like of the first metal film 80 and the second metal film 90 may be the same as the disposition, the shape, and the like discussed with respect to the light-emitting device 100 and the light-emitting device 200.

The invention claimed is:
1. A light-emitting device comprising:
a light-emitting element comprising a first electrode and a second electrode at a lower surface of the light-emitting element;
a light-transmissive member located on the light-emitting element, wherein the light-transmissive member comprises an upper surface serving as a light-emitting surface of the light-emitting device;
a light-reflective member surrounding lateral surfaces of the light-emitting element and the light-transmissive member, wherein a portion of the light-reflective member is located between the light-emitting element and the pair of first metal films, and wherein the light-reflective member comprises a lower surface that is opposite to the upper surface of the light-transmissive member, and a first lateral surface that is adjacent and orthogonal to the upper surface of the light transmissive member and serves as a mounting surface of the light-emitting device;
a pair of first metal films disposed on the lower surface of the light-reflective member; and
a pair of second metal films disposed on the first lateral surface of the light-reflective member;
wherein the first electrode of the light emitting element contacts one of the first metal films, and the second electrode of the light emitting element contacts the other of the first metal films; and
wherein an area of each of the second metal films is larger than an area of each of the first metal films.

2. The device according to claim 1, wherein each of the first metal films is continuous with a respective one of the second metal films.

3. The device according to claim 1, wherein the first metal films do not contact the second metal films.

4. The device according to claim 1, wherein the area of each of the second metal films is not less than 1.15 times the area of each of the first metal films and not more than 6 times the area of each of the first metal films.

5. The device according to claim 1, wherein:
the light-reflective member comprises a second lateral surface opposite to the first lateral surface, and
the first metal films do not contact the second lateral surface.

6. The device according to claim 1, wherein:
the light-reflective member comprises a third lateral surface, and a fourth lateral surface opposite to the third lateral surface, the third lateral surface being adjacent to the first lateral surface, the third lateral surface being adjacent and orthogonal to the lower surface of the light-reflective member, the fourth lateral surface being adjacent to the first lateral surface, the fourth lateral surface being adjacent and orthogonal to the lower surface; and
the first metal films do not contact the third and fourth lateral surfaces.

7. The device according to claim 1, wherein the second metal films do not contact the upper surface.

8. The device according to claim 1, wherein:
the light-reflective member comprises a third lateral surface, and a fourth lateral surface opposite to the third lateral surface, the third lateral surface being adjacent to the first lateral surface, the third lateral surface being adjacent and orthogonal to the lower surface, the fourth lateral surface being adjacent to the first lateral surface, the fourth lateral surface being adjacent and orthogonal to the lower surface; and
the second metal films do not contact the third and fourth lateral surfaces.

9. A light-emitting device comprising:
a light-emitting element comprising a first electrode and a second electrode at a lower surface of the light-emitting element;
a light-transmissive member located on the light-emitting element, wherein the light-transmissive member comprises an upper surface serving as a light-emitting surface of the light-emitting device; and
a light-reflective member surrounding lateral surfaces of the light-emitting element and the light-transmissive member, wherein a portion of the light-reflective member is located between the light-emitting element and the pair of first metal films, and wherein the light-reflective member comprises a lower surface that is opposite to the upper surface of the light-transmissive member, a first lateral surface that is adjacent and orthogonal to the upper surface of the light transmissive member and serves as a mounting surface of the light-emitting device, and a second lateral surface that is opposite to the first lateral surface;
a pair of first metal films disposed on the lower surface of the light-reflective member; and
a pair of second metal films disposed on the first lateral surface of the light-reflective member;
wherein the first electrode of the light emitting element contacts one of the first metal films, and the second electrode of the light emitting element contacts the other of the first metal films; and
wherein a length of each of the second metal films in a direction from the lower surface of the light-reflective member to the upper surface of the light-transmissive member is longer than a length of each of the first metal films in a direction from the first lateral surface of the light-reflective member to the second lateral surface of the light-reflective member.

10. The device according to claim 9, wherein each of the first metal films is continuous with a respective one of the second metal films.

11. The device according to claim 9, wherein the first metal films do not contact the second metal films.

12. The device according to claim 9, wherein the length of each of the second metal films is not less than 1.16 times the length of each of the first metal films and not more than 6 times the length of each of the first metal films.

13. The device according to claim 9, wherein the first metal films do not contact the second lateral surface.

14. The device according to claim 9, wherein:
the light-reflective member comprises a third lateral surface, and a fourth lateral surface opposite to the third lateral surface, the third lateral surface being adjacent to the first lateral surface, the third lateral surface being adjacent and orthogonal to the lower surface of the light-reflective member, the fourth lateral surface being adjacent to the first lateral surface, the fourth lateral surface being adjacent and orthogonal to the lower surface, and
the first metal films do not contact the third and fourth lateral surfaces.

15. The device according to claim 9, wherein the second metal films do not contact the upper surface.

16. The device according to claim 9, wherein:
the light-reflective member comprises a third lateral surface, and a fourth lateral surface opposite to the third lateral surface, the third lateral surface being adjacent to the first lateral surface, the third lateral surface being adjacent and orthogonal to the lower surface, the fourth lateral surface being adjacent to the first lateral surface, the fourth lateral surface being adjacent and orthogonal to the lower surface; and
the second metal films do not contact the third and fourth lateral surfaces.

* * * * *